US012791160B2

(12) United States Patent
Corbineau et al.

(10) Patent No.: US 12,791,160 B2
(45) Date of Patent: Nov. 10, 2026

(54) PART FOR A MOTOR VEHICLE COMPRISING AN OPACIFICATION COATING, ASSOCIATED MANUFACTURING METHOD AND LUMINOUS DEVICE COMPRISING SAID PART

(71) Applicant: VALEO VISION, Bobigny Cedex (FR)

(72) Inventors: Julien Corbineau, Angers (FR); Laurent Papin, Angers (FR)

(73) Assignee: VALEO VISION, Bobigny Cedex (FR)

( * ) Notice: Subject to any disclaimer, the term of this patent is extended or adjusted under 35 U.S.C. 154(b) by 806 days.

(21) Appl. No.: 18/044,145

(22) PCT Filed: Sep. 6, 2021

(86) PCT No.: PCT/EP2021/074524

§ 371 (c)(1),
(2) Date: Mar. 6, 2023

(87) PCT Pub. No.: WO2022/049296

PCT Pub. Date: Mar. 10, 2022

(65) Prior Publication Data

US 2023/0332756 A1 Oct. 19, 2023

(30) Foreign Application Priority Data

Sep. 7, 2020 (FR) ....................................... 2009074

(51) Int. Cl.
*F21S 43/00* (2018.01)
*C23C 14/04* (2006.01)
(Continued)

(52) U.S. Cl.
CPC ............ *F21S 43/26* (2018.01); *C23C 14/042* (2013.01); *C23C 14/0641* (2013.01);
(Continued)

(58) Field of Classification Search
CPC ....... F21S 43/26; F21S 41/285; C23C 14/042; C23C 14/0641; C23C 14/085; C23C 14/5873
(Continued)

(56) References Cited

FOREIGN PATENT DOCUMENTS

| | | |
|---|---|---|
| CN | 102459110 A | 5/2012 |
| EP | 2 169 298 A1 | 3/2010 |

(Continued)

OTHER PUBLICATIONS

International Search Report Issued Oct. 21, 2021, in PCT/EP2021/074524, filed on Sep. 6, 2021, 2 pages.

(Continued)

*Primary Examiner* — Steven O Douglas
(74) *Attorney, Agent, or Firm* — Oblon, McClelland, Maier & Neustadt, L.L.P.

(57) ABSTRACT

Part for a motor vehicle includes an opacification coating, associated manufacturing method and luminous device including the part. The part for a motor vehicle includes a polymer-based body having a surface, an opacification coating covering at least one portion of the surface. The coating is formed by at least one thin iron-based layer and includes at least one compound from among an iron oxide and an iron nitride, and has a thickness that is greater than or equal to 100 nm over at least 50% of the at least one portion of the surface. Furthermore, the coating exhibits incident light radiation absorption that is greater than 70% of the incident light radiation. Thus, the coating allows reliable and reproducible opacification of the surface of the part.

23 Claims, 4 Drawing Sheets

(51) Int. Cl.
*C23C 14/06* (2006.01)
*C23C 14/08* (2006.01)
*C23C 14/58* (2006.01)
*F21S 41/20* (2018.01)
*F21S 43/20* (2018.01)

(52) U.S. Cl.
CPC ........ *C23C 14/085* (2013.01); *C23C 14/5873* (2013.01); *F21S 41/285* (2018.01)

(58) Field of Classification Search
USPC .......................................................... 296/1.07
See application file for complete search history.

(56) References Cited

FOREIGN PATENT DOCUMENTS

| | | | |
|---|---|---|---|
| EP | 3 263 735 | A1 | 1/2018 |
| JP | 2008-77929 | A | 4/2008 |

OTHER PUBLICATIONS

French Preliminary Search Report dated May 19, 2021 in French Patent Application No. 2009074 (with Translation of Category of Cited Documents), 2 pages.

PART FOR A MOTOR VEHICLE COMPRISING AN OPACIFICATION COATING, ASSOCIATED MANUFACTURING METHOD AND LUMINOUS DEVICE COMPRISING SAID PART

TECHNICAL FIELD

The present invention relates to the field of parts for motor vehicles. The invention has a particularly advantageous application in the field of signalling and lighting for a motor vehicle.

PRIOR ART

In order to show a pattern or a visual element on the surface of a part of a motor vehicle, an opacifying coating can be used that partially covers the surface of the part. The pattern or the visual element then appears by contrasting between the opacifying coating and the surface of the part.

In lighting and/or signalling devices, for example, this coating can be arranged, for example, on a reflector or on a trim of the device, also commonly called a mask (also known as a "bezel"). A light pattern can then appear when the device is turned on, for example, in order to form a light signature of a motor vehicle model.

One solution that is generally used involves applying a layer of black paint to the surface of the part. This layer is then etched, for example, by laser ablation, in order to reveal the pattern. However, the typical thickness of a paint layer is approximately 30 μm, which requires a long laser ablation time and therefore a significant investment in laser ablation equipment. Furthermore, painting results in a significant emission of volatile organic compounds, which are harmful to the environment.

As an alternative, a luminous device for a motor vehicle is known from document JP 2008/077929 (A), in which device a resin substrate is covered with a coating formed by a thin layer of iron or of an iron alloy, with a thickness that is less than or equal to 10 nm. The assembly formed by the substrate and the resin are treated by thermal annealing in order to modulate the colour of the oxidation coating. However, thermal annealing can induce cracks in the coating, or even damage the substrate. To avoid this, the thickness of the coating is limited, which limits its opacification performance capabilities.

Therefore, an aim of the present invention is to propose a part for a motor vehicle comprising an improved, reliable and reproducible opacification coating.

The other aims, features and advantages of the present invention will become apparent upon reviewing the following description and the accompanying drawings. It is understood that other advantages can be incorporated.

SUMMARY

In order to achieve this objective, according to a first aspect, a part for a motor vehicle is provided comprising:

- a polymer-based body having a surface;
- an opacification coating covering at least one portion of the surface.

Advantageously, the coating:

- is formed by at least one thin iron-based layer and comprises at least one compound from among an iron oxide and an iron nitride; and
- has a thickness that is greater than or equal to 100 nm over at least 50% of the at least one portion of the surface.

Advantageously, the coating exhibits incident light radiation absorption that is substantially greater than 70%, preferably substantially greater than 80%, and even more preferably substantially greater than 90%, of the incident light radiation. This light radiation particularly can be in the visible range. Alternatively or additionally, the coating exhibits reflection of incident light radiation that is substantially less than 30%, preferably substantially less than 20%, and even more preferably substantially less than 10%, of the incident light radiation.

Black iron oxide and/or iron nitride allows the thin layer to be opacified relative to a layer based on non-oxidized or nitrided iron. Furthermore, this opacification is thus predominantly provided by the incident light radiation absorption, and not by the reflection of this radiation. The coating thus has a dark colour and a non-metallized appearance. The layer is thick enough, over most of the coated surface, to provide good opacification of the surface of the part. Furthermore, the thickness of the layer allows good opacification to be provided for a set of parts, despite any variation in the thickness between the parts when they are manufactured. The opacification coating is therefore reliable and reproducible. The material of the layer also costs less compared to that of the paint that is commonly used, thus reducing the cost of the part.

Optionally, the part can also have at least any one of the following features, which can be taken separately or in combination.

The opacification coating can be configured so as to form at least one opacified area in the vicinity of the at least one portion of the surface, and at least one uncoated area. The opacification coating only partially covers the surface of the body of the part, in order to show a pattern or a visual element on the surface of the part.

The body can be at least partially transparent, or even transparent. In a synergistic manner with the feature whereby the opacification coating is configured so as to form at least one opacified area in the vicinity of the at least one portion of the coated surface, and at least one uncoated area, the opacified area allows light transmission to be blocked, and the uncoated area forms a passing area allowing light transmission. The uncoated area can form a light exit diopter in a luminous device.

The part can be a part of a lighting and/or signalling device of a vehicle, in particular a reflector, a trim or a closure outer lens.

A second aspect of the invention relates to a luminous device for a motor vehicle comprising a part for a motor vehicle according to the first aspect, and a light source, for at least one function selected from among a lighting function and a signalling function.

The body of the part can be at least partially transparent, or even transparent, and the opacification coating can be configured so as to form at least one opacified area in the vicinity of the at least one portion of the surface, and at least one uncoated area, and wherein the uncoated area forms a light exit diopter.

The part can be a trim of a headlight. In this case, and according to the preceding paragraph, a signalling function can be carried out through the uncoated area. For example, this signalling function can be a direction indicator, a position light (also called "Parking Light") and/or a daytime running light (DRL).

According to the invention, the part can be an element of an interior lighting device of the vehicle, such as a ceiling or a luminous trim of the passenger compartment, and/or can be an information display device, in particular a panel or a part of a panel of the dashboard.

A third aspect of the invention relates to a vehicle equipped with a luminous device according to the second aspect of the invention.

A fourth aspect of the invention relates to a method for manufacturing a part for a motor vehicle comprising:

supplying a polymer-based body having a surface;

at least one deposition of a thin iron-based layer in an atmosphere comprising at least one reactive gas selected from among dioxygen, dinitrogen, on at least one portion of the surface that is to be opacified, such that the thin layer comprises at least one compound from among an iron oxide and an iron nitride, and has a thickness that is greater than 100 nm over at least 50% of the at least one portion of the surface, in order to form an opacification coating.

Through a reaction between the at least one reactive gas and the iron during the deposition, the thin layer that is obtained comprises at least one compound from among an iron oxide and an iron nitride, without requiring additional annealing. Consequently, the thickness of the layer can be increased compared to the existing solutions, which allows good opacification to be provided while minimizing, or even avoiding, the risk of cracking in the coating and of damaging the body of the part. The opacification coating that is obtained is therefore reliable and reproducible. Furthermore, this manufacturing method costs less compared to the application of a paint, thus reducing the cost of the part. Furthermore, the emission of volatile organic compounds is reduced, or even avoided, when depositing the thin layer, or even more so by the absence of annealing, reducing the environmental impact of the method compared to the existing solutions.

According to one embodiment, the method can further comprise at least one step from among:

applying a partial mask to the surface before depositing the thin layer, followed by the removal of the mask after depositing the thin layer; and laser ablation of a portion of the deposited thin layer.

Thus, the opacification coating that is obtained forms at least one opacified area in the vicinity of the at least one portion of the surface that is to be opacified, and at least one uncoated area. In a synergistic manner with the laser ablation of the thin layer, the thickness of the deposited layer allows the laser ablation time to be reduced threefold compared to the laser ablation of a paint layer.

BRIEF DESCRIPTION OF THE FIGURES

The aims, objects, features and advantages of the invention will become more clearly apparent from the detailed description of one embodiment of the invention, which embodiment is illustrated by the following accompanying drawings, in which:

FIGS. 3 to 9 schematically illustrate the steps of the method for manufacturing the part for a motor vehicle according to one embodiment of the invention, and more specifically:

FIG. 3 illustrates the provision of a body;

FIGS. 4 to 6 illustrate the deposition of a thin layer according to various embodiments;

FIG. 5

FIG. 6

FIG. 7 illustrates laser ablation of the thin layer;

FIG. 9 shows a schematic view of the part for a motor vehicle and the opacification coating that is obtained after the laser ablation illustrated in FIG. 7 or after the removal of the mask illustrated in FIG. 8B, according to one embodiment of the invention.

Figure 1:
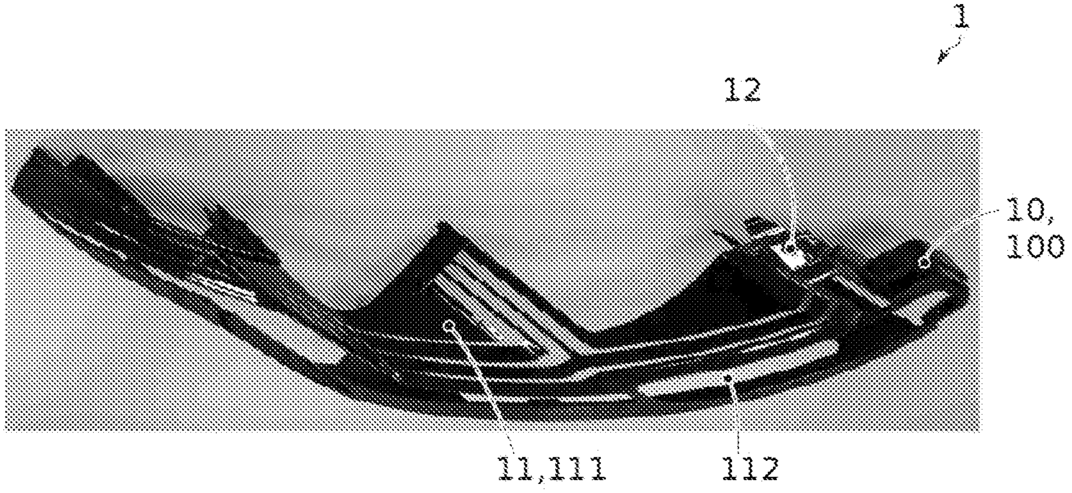
FIG. 1 shows an overall view of a part for a motor vehicle according to one embodiment of the invention.

The drawings are provided by way of examples and by no means limit the invention. They are schematic conceptual depictions intended to facilitate the understanding of the invention and are not necessarily drawn to the scale of practical applications. In particular, the relative thicknesses of the thin layers and of the body do not reflect the reality.

DETAILED DESCRIPTION

Before beginning a detailed review of embodiments of the invention, the optional features of the first aspect of the invention are set forth hereafter, which features optionally can be used in combination or alternatively:

the shape of the body of the part is at least two-dimensional, or even three-dimensional;

the body is opaque;

the surface of the body has a distinct colour from a colour of the coating;

the thin layer is directly in contact with the at least one portion of the surface;

the thin layer comprises at least one compound from among an iron oxide and an iron nitride throughout its thickness;

the opacification coating has a thickness that is greater than or equal to 200 nm over at least 30% of the at least one portion of the surface;

the opacification coating has a thickness that is less than or equal to 1 m, and preferably less than or equal to 600 nm;

the opacification coating has, over at least 50% of the at least one portion of the surface, a colour in the 1976 CIE L*a*b* colour space defined by the L*, a* and b* parameters, where:

L* ranges between 20 and 55, and preferably between 25 and 50;

a* ranges between −5 and +5;

b* ranges between −5 and +5.

According to one example L is substantially equal to 30. The opacification coating is thus black. According to one example L is substantially equal to 45. The opacification coating is thus anthracite grey.

Optional features of the fourth aspect of the invention are set forth hereafter, which optionally can be used in combination or alternatively:

the thin layer is deposited at a pressure ranging between $10^{-4}$ mbar and $10^{-1}$ mbar, and preferably between $10^{-3}$ mbar and $10^{-2}$ mbar;

the atmosphere comprises dioxygen with a dioxygen rate ranging between 10% and 100%, and preferably between 20% and 80%;

the atmosphere comprises dioxygen with a dioxygen rate ranging between 10% and 25%, and preferably between 20% and 25%;

atmosphere comprises dioxygen with a dioxygen rate ranging between 25% and 100%, and preferably between 25% and 80%;

the at least one reactive gas is diluted in an inert gas, for example, in argon;

the at least one reactive gas is a mixture of dioxygen and dinitrogen, and more specifically of air;

the reactive gas is only dioxygen;

the deposition of the thin layer is a physical vapour deposition;

the deposition of the thin layer can be a deposition selected from among:

plasma-assisted thermal evaporation deposition;

electron-beam physical vapour deposition (commonly referred to as EBPVD);

cathode sputter deposition.

It should be noted that, within the scope of the present invention, expressions such as "equal to, less than, greater than" are understood to mean comparisons that can accommodate certain tolerances, in particular according to the size scale of the compared values and the measurement uncertainties. Similarly, the expression "ranging between" denotes a range of values that can accommodate certain tolerances, in particular according to the size scale of the values of the range and the measurement uncertainties. Substantially equal, lower or higher values are included in the scope of understanding of the invention.

A parameter that is "substantially equal to/greater than/less than" a given value is understood to mean that this parameter is equal to/greater than/less than the given value, plus or minus 10%, close to this value. A parameter that "substantially ranges between" two given values is understood to mean that this parameter is at least equal to the smallest given value, plus or minus 10%, close to this value, and at most equal to the largest given value, plus or minus 10%, close to this value.

An element based on a material A is understood to mean an element comprising this material A and optionally other materials.

Throughout the following description, the thicknesses are generally measured in directions perpendicular to the plane of the upper face of a substrate on which the layer is disposed. Thus, the thicknesses are generally taken in a vertical direction on the cross-sectional views that are shown.

A "partially transparent" element is understood to mean an element configured to at least partially transmit incident light rays, and more specifically at least 20%, or even at least 40%, or even at least 50%, or even at least 70%, of the incident light rays, with these light rays particularly being in the visible range.

The part for a motor vehicle will now described with reference to FIGS. 1, 2 and FIG. 9.

The part 1 for a motor vehicle comprises a body 10. The body 10 has a surface 100, at least one portion 1000 of which is covered by an opacification coating 11, configured to at least partly mask the surface 100 of the body 10. Thus, the external appearance or the properties of the surface 100 can be masked, for example, its diffusion, reflection and/or light transmission properties. More specifically, the opacification coating covers at least one portion 1000 of the surface 100, or even a plurality of portions 1000, in order to show a pattern or a visual element on the surface 100 of the part 1.

Figure 9:
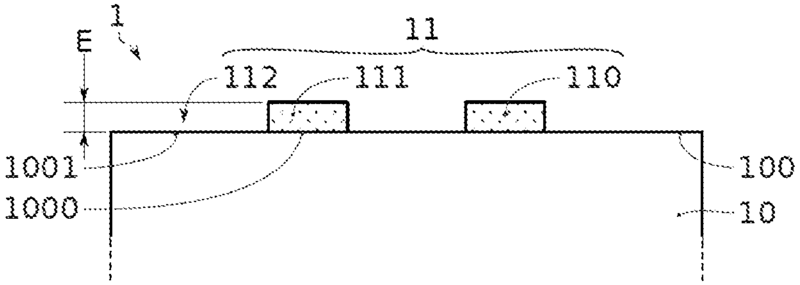

As illustrated in FIGS. 1 and 9, the coating 11 can form at least one opacified area 111, or even a plurality of opacified areas, and at least one uncoated area 112, or even a plurality of uncoated areas 112, on the surface 100 of the part. The opacified area 111 and the coated area 112 by contrast can form a visual element or a pattern.

As illustrated in FIG. 1, the part 1 can be a vehicle headlamp trim, for example, intended to be placed below or above lighting modules.

The part 1 can be included in a luminous device 2 for a motor vehicle, for example, mounted by a fastening element 12. The luminous device 2 comprises a light source 20 and provides a lighting function and/or a signalling function.

The luminous device 2 can be a signalling module, integrated into a vehicle tail light or even, as in the case herein, a vehicle headlight, also called headlamp.

Figure 2:
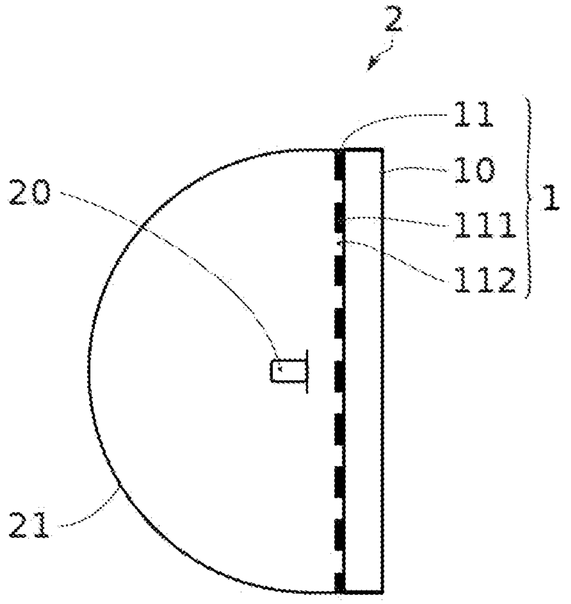
FIG. 2 shows a schematic view of a luminous device of a motor vehicle according to one embodiment of the invention.

According to the non-limiting example illustrated in FIG. 2, the luminous device 2 is a signalling module integrated into a headlight and comprising a light source 20, for example, a light-emitting diode, a reflector 21 arranged facing the light source 20 and an exit diopter.

According to an example that is not illustrated, the part 1 can be the reflector 21 of the luminous device 2. The opacified area 111 of the coating 11 can prevent light reflection by the reflector 21 and the uncoated area 112 can allow this reflection.

According to an example illustrated in FIG. 2, the part 1 can be included in, or even form, the exit diopter of the luminous device 2. The opacified area 111 of the coating 11 can prevent the transmission of light from the reflector 21. The uncoated area can allow this transmission and thus the lighting function. In FIG. 1, this isolated part 1 can be seen, which part forms both the trim of the headlight and an exit screen of a signalling module, such as a direction indicator, a position light and/or a daytime running light.

According to one example, the coating is arranged on the inner face of the part 1 in order to be protected from possible impacts and bad weather. Thus, the lifetime of the coating 11, and consequently of the part 1, can be increased. According to another example, the coating is arranged on the outer face of the part 1. The part 1 then can be arranged inside an assembly, for example, a sealed assembly. The coating then can be protected from possible impacts and bad weather. When the part 1 is included in, or even forms, the exit diopter of the luminous device 2, it is preferable for the coating to be arranged on the outer face of the part 1. This thus prevents any elements that are present in the thickness of the part 1 from being visible. In addition or as an alternative to arranging the part 1 in an assembly, the coating can be covered with a protective layer configured to withstand possible impacts and bad weather. For example, this protective layer is a colourless or tinted varnish.

The body 10 of the part 1 will now be described in detail. The body 10 is based on a polymer, or even on several polymers. The polymer can be selected from among polycarbonate, polymethyl methacrylate, butyl polymethacrylate, polypropylenes, polyamides, polyethylenes, polyethers, polyester resins, epoxys, polyurethanes, and other thermoplastic and thermosetting materials, uncoated or previously coated with one or more polymer sub-layers, and their derivatives. For example, polycarbonate has excellent mechanical properties and thermal resistance allowing use over a wide temperature range, typically between −100° C. and 130° C., or even up to 180° C. for "high temperature" grade polycarbonates, which is particularly advantageous for a part 1 for a motor vehicle. It should be noted that the body 10 can comprise other materials, for example, a filler and/or a reinforcement in order to form a composite. The body 10 of the part 1 also can have a shape that is at least two-dimensional, or even three-dimensional. When the part 1 is included in, or even forms, the exit diopter of the luminous device 2, the body 10 is preferably three-dimensional.

According to one example, the body 10 can be opaque. The surface 100 of the body 10 can have a distinct colour from the coating 11 in order to show a visual element or a pattern contrasting between the uncoated area 112 on the surface 100 and the opacified area 111.

Alternatively, the body 10 can be partially transparent, or even transparent. The coating 11 can form at least one opacified area 111 and at least one uncoated area 112. The opacified area 111 allows light transmission to be blocked on the surface 100 of the body 10, and the uncoated area 112 forms a passing area allowing light transmission, and therefore can form an exit diopter.

The body 10 can also comprise a diffusing filler, in particular so as to form an exit diopter diffusing the transmitted light.

The coating 11 will now be described in detail. The coating 11 is formed by at least one thin layer 110. The coating 11 is configured to opacify at least one coated portion 1000 of the surface 100. Preferably, the portion 1000 coated by the coating cannot be seen by a user, and more particularly its colour can be masked. As illustrated in FIG. 9, the thin layer 110 can be directly in contact with the surface 100.

The thin layer 110 is based on iron and comprises at least one compound from among an iron oxide and an iron nitride. The black iron oxide and/or the iron nitride allows the layer 110 to be darkened and thus effectively opacified compared to a layer based on non-oxidized or nitrided iron, with a metal appearance.

The coating 11 is more specifically configured to opacify the part 1 predominantly by light absorption, rather than by reflection, as is the case in the existing solutions for opacifying parts by bleaching or by the mirror effect. To this end, the coating 11 can be configured to have incident radiation absorption that is substantially greater than 70%. The incident radiation more specifically belongs to the visible range. According to one example, the coating has incident radiation absorption that is substantially greater than 80%. Thus, the coating has a grey shade with satisfactory opacification of the part 1. According to one example, the coating has incident radiation absorption that is substantially greater than 90%. Thus, the coating has a black shade with satisfactory opacification of the part 1. According to an alternative or additional example, the coating 11 can be configured to have incident light radiation reflection that is substantially less than 30%, preferably substantially less than 20%, and even more preferably substantially less than 10%.

The colour of the coating 11 can be described in the 1976 CIE L*a*b* colour space, generally used for characterizing surface colours. In this space, three parameters characterize the colours: the lightness L* describes the luminance of the surface; the two parameters a* and b* express the deviation of the colour compared to that of a grey surface with the same lightness. Preferably:

- L* ranges between 20 and 55, and preferably between 25 and 50;
- a* ranges between −5 and +5;
- b* ranges between −5 and +5.

The coating 11 thus has a grey-to-black colour, ensuring effective opacification of the coated portion 1000. For example, L* is substantially equal to 30, which corresponds to black. According to another example, L* is substantially equal to 45, which corresponds to grey, and more specifically anthracite grey. A method for measuring the colour of the coating 11 in the 1976 CIE L*a*b* colour space involves using a spectrocolorimeter in contact with the coating. The values of L*, a* and b* are measured by the spectrocolorimeter. For example, a CM-700 or CM-2600 spectrocolorimeter by Konica Minolta® can be used.

The coating 11 has a thickness E that is greater than or equal to 100 nm over at least 50% of the coated portion 1000. Thus, the layer is thick enough to provide good opacification of the coated portion 1000, over most of this portion 1000. Furthermore, this thickness allows good opacification to be provided for a set of parts 1, despite any variation in the thickness between the parts 1 when the layer 110 is deposited, which is described hereafter. The opacification coating 11 is therefore reliable and reproducible. The thickness E of the coating 11 more specifically can be greater than or equal to 200 nm over at least 30% of the coated portion 1000. The layer 110 thus provides even better opacification of the coated portion 1000. The thickness E of the coating can be less than or equal to 1 μm, and preferably less than or equal to 600 nm, in order to minimize the cost associated with the preparation of the coating 11.

Other features of the coating 11 are described hereafter in the description of the method for manufacturing the part 1.

The method for manufacturing the part 1 will now be described with reference to FIGS. 3 to 9.

Figure 3:
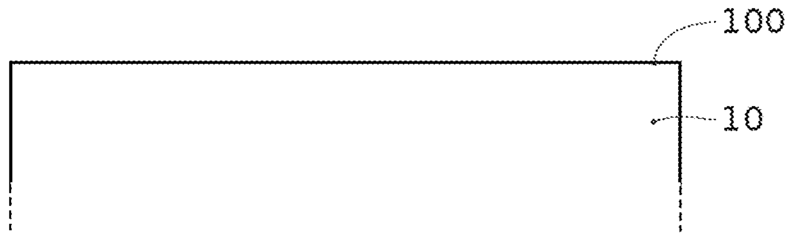

As illustrated in FIG. 3, the method comprises the provision of a body 10 according to the features described above.

The method then comprises at least one deposition of a thin layer 110, in order to obtain a layer 110 comprising at least one compound from among an iron oxide and an iron nitride. To this end, the layer 110 can be formed by oxidizing and/or nitriding iron. For example, the iron can originate from a metal source based on iron evaporated during deposition, and the layer 110 can be formed by condensation of the metal after oxidizing and/or nitriding. The metal source can be pure iron or an iron alloy, and more specifically can be any type of steel, including stainless steel.

In order to allow oxidizing and/or nitriding, the deposition can be carried out in an atmosphere comprising at least one gas suitable for reacting at least with the iron, which gas is equally called reactive gas. The reactive gas can be diluted in a gas that does not react during deposition, which gas is equally called inert gas, such as argon, for example. The reactive gas can be selected from among dioxygen, for an oxidizing reaction, and dinitrogen, for a nitriding reaction.

According to one example, the reactive gas is dioxygen, optionally mixed with dinitrogen and/or diluted in an inert gas. The atmosphere can include dioxygen with a dioxygen rate ranging between 10% and 100%, and preferably between 20% and 80%. Depending on the dioxygen rate, the oxidation reaction between the iron and the dioxygen can be modulated.

A reduction in the dioxygen content induces a lower reaction with the iron, which allows the iron oxide concentration in the layer 110 to be reduced and a grey colour to be obtained. In addition, the reduction of the dioxygen content allows a dioxygen-related risk of explosion to be overcome. The oxygen rate can, for example, range between 10 and 25%, and preferably between 20 and 25%, in order to obtain a grey coating 11. The reactive gas can be a mixture of dioxygen and dinitrogen, in which the oxygen rate can be substantially equal to 20%. The reactive gas is air, for example, thus minimizing the cost of the coating 11 and of the deposition equipment.

By increasing the dioxygen content, the oxidation reaction of the iron is promoted, which allows the iron oxide concentration in the layer 110 to be increased. The dioxygen rate in the atmosphere can range between 25% and 100%, and preferably between 25% and 80% in order to obtain a black coating 11. Indeed, between 80% and 100% of oxygen, the atmosphere can be very reactive and induce yellow, red or blue coloured reflections. In order to avoid any risk of explosion induced by a dioxygen content that is greater than 25%, the deposition equipment can include a safety unit, for example, a dry pumping unit.

The deposition time and the pressure of the atmosphere can be configured to modulate the thickness of the deposited layer 110. During deposition, the pressure can range between $10^{-4}$ mbar and $10^{-1}$ mbar, and preferably between $10^{-3}$ mbar and $10^{-2}$ mbar (with 1 mbar=$10^{-3}$ bar=100 Pa in the international system of units). A pressure above these ranges can particularly result in inhomogeneities in the layer 110, and the formation of a rough deposit giving the coating a powdery appearance. A pressure below this range also may not be sufficient to allow the reaction between the iron and the reactive gas, and thus give the layer 110 a metal appearance. It should be noted that these parameters can be adjusted depending on the deposition technique that is used. A pressure ranging between $10^{-4}$ mbar and $10^{-1}$ mbar is particularly suitable for electron-beam physical vapour deposition. A pressure ranging between $10^{-3}$ mbar to $10^{-2}$ mbar is particularly suitable for plasma-assisted thermal evaporation and cathode sputter deposition.

Figure 4:
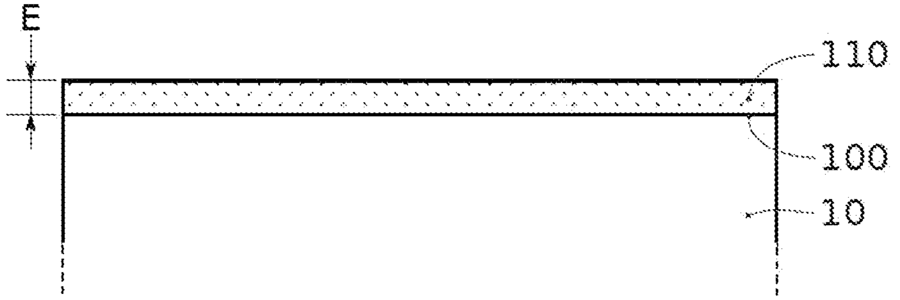
Figure 5:
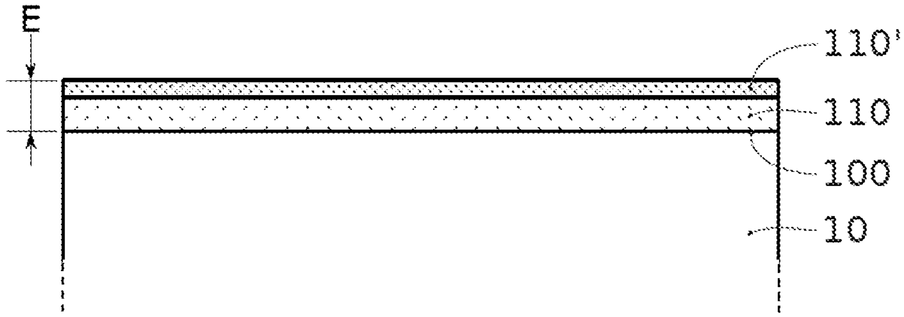
Figure 6:
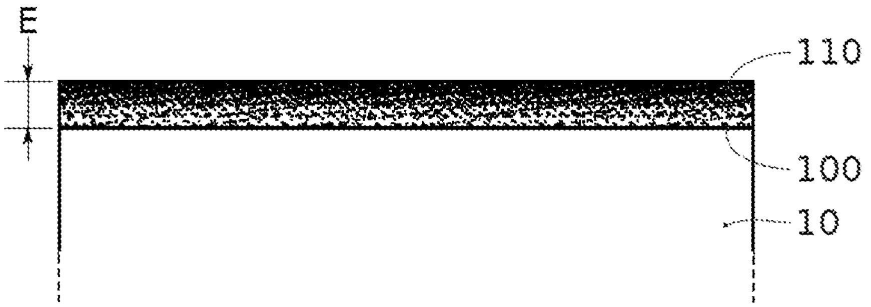

As illustrated in FIGS. 4 to 6, the layer 110 can be deposited on an upper surface 100 of the body 10. It should be noted that the layer 110 also can be deposited on lateral surfaces 100 of the body 10. Furthermore, the body 10 can have a three-dimensional shape, for example, having material reliefs, the layer 110 can be deposited on the surface 100 following its three-dimensional shape. According to the deposition technique that is used, the layer 110 can be compliant or non-compliant. The term "compliant" is understood to mean that the layer has, to the nearest manufacturing tolerances, an identical thickness despite the changes in direction of the layer 110. When the layer 110 is non-compliant, its thickness can vary between different sections of the layer. Consequently, it is understood that only part of the layer 110 can have the thickness E described above.

The method can include the deposition of a plurality of thin layers 110, 110'. According to the example illustrated in FIG. 6, the deposition parameters particularly can be adapted to modulate the iron oxide and/or iron nitride concentration in the thin layer 110 between the various layers 110, 110'. Alternatively or additionally, the deposition of the thin layer 110 also can be configured such that the layer 110 has an iron oxide and/or iron nitride concentration gradient in the thin layer 110. The layer 110 can particularly have a concentration gradient in a direction perpendicular to the surface 100 of the body.

In order to form the opacified area 111 and the uncoated area 112, the method can include at least one process selected from among applying a partial mask 3 to the surface 100 before depositing the thin layer 110, and laser ablation of a portion 112' of the deposited thin layer 110.

Figure 7:
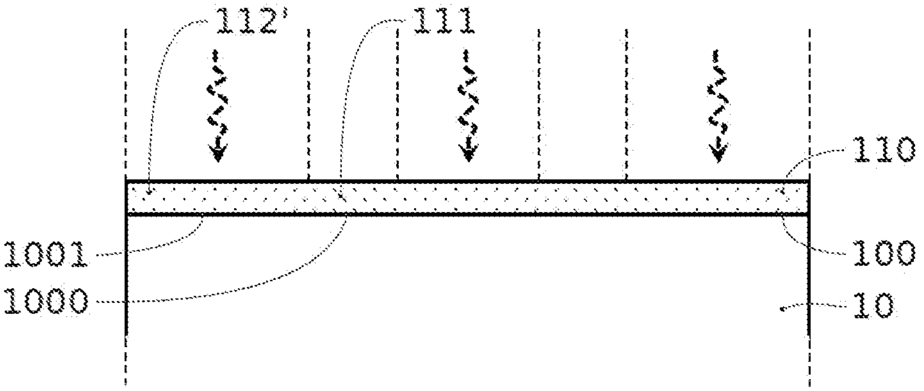

As illustrated in FIG. 7, the deposited layer 110 can be subjected to laser radiation in order to etch the layer 110. The laser radiation can be configured so as to etch a portion 112' of the layer 110 on a portion 1001 of the surface 100. Thus, the portion 1001 of the surface can be completely uncoated, as illustrated in FIG. 9. According to an example that is not illustrated, the laser radiation can be configured such that etching of the layer 110 is partial, for example, in order to obtain a gradual variation in the thickness E of the layer 110 between an uncoated area 112 and an opacified area 111. The power of the laser radiation and the ablation time can be particularly adapted to this end.

Figure 8A:
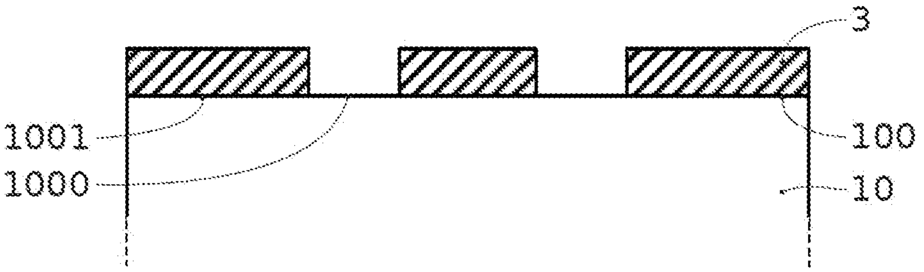
FIG. 8A illustrates the application of a mask on the surface of the supplied body.
Figure 8B:
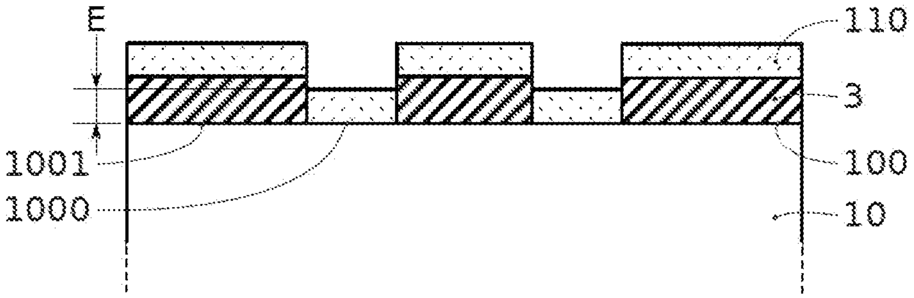
FIG. 8B illustrates the deposition of a thin layer following the application of the mask illustrated in FIG. 8A.

As illustrated in FIG. 8A, the method can include applying a mask 3 to a portion 1001 of the surface 100 that is intended to be uncoated. The layer 110 then can be deposited on the assembly formed by the body 10 and the mask 3, as illustrated in FIG. 8B. By removing the partial mask 3, the opacified area 111 and the uncoated area 112 are formed, as illustrated by the transition from FIG. 8B to FIG. 9.

The layer 110 can be deposited using a physical vapour deposition technique. The layer 110 can be deposited using plasma-assisted thermal evaporation. Thermal evaporation deposition is fast and is therefore particularly suitable for high-thickness thin layer deposition. The plasma also allows the oxidizing and/or nitriding reaction between the iron and the reactive atmosphere. During plasma-assisted thermal evaporation deposition, the first deposited atomic layers can have a higher iron concentration than the oxygen concentration, or even of oxygen and nitrogen, if applicable. As the iron is deposited, the iron concentration and the oxygen element concentration, and of nitrogen, if applicable, can balance in order to achieve the stoichiometric proportions of the iron oxide and/or of the nitride, and thus form a concentration gradient in the layer 110, in a direction perpendicular to the surface 100 of the body 10.

The layer 110 can be deposited using electron-beam physical vapour deposition. Depending on the power of the electron-beam, electronbeam physical vapour deposition allows the deposition rate of the thin layer to be modulated, and thus of the features of the layer that is obtained. For example, a first layer 110 can be deposited at a fast rate. The oxidizing or nitriding reaction of the iron then can be incomplete. The layer 110 then can have a higher iron concentration than the oxygen concentration, or even of oxygen and nitrogen, if applicable. A second layer 110 then can be deposited at a lower rate in order to obtain a finishing layer 110 exhibiting good stoichiometry and thus ensuring the opacification by the coating 11.

The layer 110 can be deposited by reactive cathode sputtering. Atomic sputtering deposition is fast and is therefore particularly suitable for high-thickness thin layer deposition. Furthermore, the thin layer 110 that is obtained can have better adhesion since the ions created during cathode sputtering have enough energy to be slightly implanted in the surface 100 of the body 10. Furthermore, using this technique, the thin layer 110 retains the stoichiometry of the elements of the source material, thus allowing the features of the layer that is obtained to be modulated. According to one example, the layer is deposited by magnetron cathode sputtering. The metal source is then a non-magnetic source, and, for example, made of stainless steel. Due to the presence of chromium in the metal source, the reaction between the iron and the oxygen is limited, which results in a grey colour for the coating 11.

By way of an example, an operating mode of the method will now be described, in which the thin layer is deposited by plasma-assisted thermal evaporation, in which:

- the thermal evaporation is carried out with a voltage supply ranging between 1 V and 10 V, preferably between 3 V and 7 V, and with a current supply ranging between 100 A to 10,000 A, preferably substantially ranging between 500 A and 3,000 A;
- the plasma is powered by a direct current, or by a medium-frequency alternating current, for example, 40 kHz, or even by radio frequency, or by microwaves. When the plasma is powered by a direct current, or by a medium-frequency alternating current, for example, 40 kHz, the plasma is supplied with a voltage ranging between 500 V and 10,000 V, preferably between 2,000 V and 6,000 V, and with a current ranging between 0 mA and 5,000 mA, preferably between 50 mA and 1,000 mA;

the evaporation time ranges between 50 seconds (s) and 1,000 s, preferably between 150 s and 400 s;

the pressure ranges between $10^{-4}$ mbar and $10^{-1}$ mbar, preferably between $10^{-3}$ mbar and $10^{-2}$ mbar.

In view of the above description, it is clearly apparent that the invention proposes a part for a motor vehicle comprising an improved, reliable and reproducible opacification coating.

The invention is not limited to the embodiments described above and extends to all the embodiments covered by the claims.

LIST OF NUMERICAL REFERENCES

1 Part
10 Body
100 Surface
1000 Portion to be opacified
1001 Uncoated portion
11 Opacification coating
110 Thin layer
110 Second thin layer
111 Opacified area
112 Uncoated area
112' Portion of the thin layer
12 Fastening element
2 Luminous device
20 Light source
21 Reflector
22 Exit diopter
3 Mask

The invention claimed is:

1. A part for a motor vehicle comprising:

a polymer-based body having a surface;

an opacification coating covering at least one portion of the surface; and wherein the coating:

is formed by at least one thin iron-based layer and comprises at least one compound from among an iron oxide and an iron nitride;

has a thickness that is greater than or equal to 100 nm over at least 50% of the at least one portion of the surface; and exhibits incident light radiation absorption that is greater than 70% of the incident light radiation.

2. The part according to claim 1, wherein the opacification coating is configured so as to form at least one opacified area in the vicinity of the at least one portion of the surface, and at least one uncoated area.

3. The part according to claim 1, wherein the opacification coating has a thickness that is greater than or equal to 200 nm over at least 30% of the at least one portion of the surface.

4. The part according to claim 1, wherein the opacification coating has a thickness that is less than or equal to 1 μm.

5. The part according to claim 1, wherein the body is at least partially transparent.

6. The part according to claim 1, wherein the opacification coating has, over at least 50% of the at least one portion of the surface, a colour in the 1976 CIE L*a*b* colour space, in which the colour in the 1976 CIE L*a*b* colour space is defined by parameter L*, parameter a* and parameter b*, wherein:

the parameter L* ranges between 20 and 55;

the parameter a* ranges between −5 and +5; and the parameter b* ranges between −5 and +5.

7. A luminous device for a motor vehicle comprising a part for a motor vehicle according to claim 1, and a light source, for at least one function selected from among a lighting function and a signalling function.

8. The luminous device according to claim 7, wherein the body is at least partially transparent, and the opacification coating is configured so as to form at least one opacified area in the vicinity of the at least one portion of the surface, and at least one uncoated area, and wherein the uncoated area forms a light exit diopter.

9. Method A method for manufacturing a part for a motor vehicle comprising:

supplying a polymer-based body having a surface;

at least one deposition of a thin iron-based layer in an atmosphere comprising at least one reactive gas selected from among dioxygen, dinitrogen, on at least one portion of the surface that is to be opacified, such that the thin layer comprises at least one compound from among an iron oxide and an iron nitride, and has a thickness that is greater than 100 nm over at least 50% of the at least one portion of the surface, in order to form an opacification coating.

10. The method according claim 9, the method further comprising at least one step from among:

applying a partial mask to the surface before depositing the thin layer (110), followed by the removal of the mask after depositing the thin layer; and laser ablation of a portion of the deposited thin layer.

11. The method according to claim 9, wherein the thin layer is deposited at a pressure ranging between 10-4 mbar and 10-1 mbar.

12. The method according to claim 9, wherein the atmosphere comprises dioxygen with a dioxygen rate ranging between 10% and 100%.

13. The method according to claim 9, wherein the atmosphere comprises dioxygen with a dioxygen rate ranging between 10% and 25%.

14. The method according to claim 9, wherein the atmosphere comprises dioxygen with a dioxygen rate ranging between 25% and 100%.

15. The method according to claim 9, wherein the deposition of the thin layer is a physical vapour deposition selected from among:

plasma-assisted thermal evaporation deposition;

electron-beam physical vapour deposition; and cathode sputter deposition.

16. The part according to claim 2, wherein the opacification coating has a thickness that is greater than or equal to 200 nm over at least 30% of the at least one portion of the surface.

17. The part according to claim 2, wherein the opacification coating has a thickness that is less than or equal to 1 μm.

18. The part according to claim 2, wherein the body is at least partially transparent.

19. The part according to claim 2, wherein the opacification coating has, over at least 50% of the at least one portion of the surface, a colour in the 1976 CIE L*a*b* colour space, in which the colour in the 1976 CIE L*a*b* colour space is defined by parameter L*, parameter a* and parameter b*, wherein:

the parameter L* ranges between 20 and 55;
the parameter a* ranges between −5 and +5; and
the parameter b* ranges between −5 and +5.

20. A luminous device for a motor vehicle comprising a part for a motor vehicle according to claim 2, and a light source, for at least one function selected from among a lighting function and a signalling function.

21. The method according to claim 9, wherein the atmosphere comprises dioxygen with a dioxygen rate ranging between 20% and 80%.

22. The method according to claim 9, wherein the atmosphere comprises dioxygen with a dioxygen rate ranging between 20% and 25%.

23. The method according to claim 9, wherein the atmosphere comprises dioxygen with a dioxygen rate ranging between 25% and 80%.

* * * * *